United States Patent [19]

Naka et al.

[11] Patent Number: 5,384,480

[45] Date of Patent: Jan. 24, 1995

[54] CLEAR-MOLD SOLID-STATE IMAGING DEVICE USING A CHARGE COUPLED DEVICE

[75] Inventors: Shun-ichi Naka, Habikino; Takayoshi Ishida, Sakurai, both of Japan

[73] Assignee: Sharp Kabushiki Kaisha, Osaka, Japan

[21] Appl. No.: 6,923

[22] Filed: Jan. 22, 1993

[30] Foreign Application Priority Data

Jan. 22, 1992 [JP] Japan .................................. 4-009335

[51] Int. Cl.[6] .................. H01L 29/161; H01L 29/205; H01L 29/225; H01L 33/00
[52] U.S. Cl. .................................... 257/414; 257/431; 257/432; 257/436; 257/437
[58] Field of Search ................ 257/787, 788, 790, 791, 257/792, 798, 414, 431, 432, 436, 437

[56] References Cited

U.S. PATENT DOCUMENTS 5,126,826  6/1992  Kauchi et al. ................ 257/787

FOREIGN PATENT DOCUMENTS 0488647  6/1992  European Pat. Off. .
0492144  7/1992  European Pat. Off. .
0503666  9/1992  European Pat. Off. .
2-262367  10/1990  Japan .

OTHER PUBLICATIONS

Chemical Abstracts, vol. 115, No. 26, Dec. 30, 1991 H. Yamamoto "Solid state imaging device using charge-couplet devices", p. 779, column 1 abstract No. 291 347n & Jpn Kokai Tokkyo Koho JP 03 54 862 (91 54 862).

Primary Examiner—Andrew J. James
Assistant Examiner—Carl Whitehead, Jr.
Attorney, Agent, or Firm—David G. Conlin; George W. Neuner

[57] ABSTRACT

A clear-mold solid-state imaging device using a charge coupled device, in which a solid-state imaging device is molded with a transparent resin. The solid-state imaging device includes a surface having a light receiving section; a light shielding film provided over the surface; a transparent passivation film for protecting the light shielding film; and a moving ion blocking layer provided between the transparent passivation film and the transparent resin.

6 Claims, 2 Drawing Sheets

CLEAR-MOLD SOLID-STATE IMAGING DEVICE USING A CHARGE COUPLED DEVICE

BACKGROUND OF THE INVENTION

1. Field of the Invention

The present invention relates to a solid-state imaging device using a charge coupled device (hereinafter, referred to as the CCD), and in particular, to a solid-state imaging device using a CCD which is molded with a transparent resin. Hereinafter, the solid-state imaging device using a CCD will be referred to as a CCD solid-state imaging device.

2. Description of the Related Art

As an example of a packaged CCD solid-state imaging device, a clear-mold CCD solid-state imaging device which is molded with a transparent resin has actively been developed.

FIG. 4 is a schematic cross sectional view of a conventional clear-mold CCD solid-state imaging device 40 which is molded with a transparent resin 20. The clear-mold CCD solid-state imaging device 40 includes a one-chip CCD solid-state imaging device 10 and an input/output terminal 30. A surface of the one-chip CCD solid-state imaging device 10, the surface having a light receiving section, is covered with a transparent passivation film 17 formed of silicon oxide, silicon nitride, or the like. The one-chip CCD solid-state imaging device 10 is entirely covered with the transparent resin 20 formed of a heat-curing resin such as an epoxy resin. The transparent resin 20 is provided in order to protect the one-chip CCD solid-state imaging device 10 from an external physical impact and also from moisture and oxide in the air.

FIG. 3 is a cross sectional view of the one-chip CCD solid-state imaging device 10 and a vicinity thereof. The one-chip CCD solid-state imaging device 10 includes a semiconductor substrate 11, a plurality of photodiodes 12 arranged in a matrix (namely, in a plurality of rows), and CCDs 13 respectively provided adjacent to the rows of the photodiodes 12. The photodiodes 12 each act as a light receiving section. A silicon oxide film 14 is provided on the semiconductor substrate 11 so as to cover the photodiodes 12 and the CCDs 13. Two polysilicon electrodes 15 are provided in a stack above each CCD 13. Each CCD 13 and the two polysilicon electrodes 15 constitute a transfer section 21. Incident light is converted into electric charges, and the electric charges are transferred through the transfer section 21 to another transfer section (not shown) provided perpendicular to the CCDs 13. Light shielding films 16 formed of aluminum or the like are provided on areas of a surface of the silicon oxide film 14, the areas being above the polysilicon electrodes 15. The light shielding films 16 are protected by the transparent passivation film 17 laminated on the silicon oxide film 14.

The one-chip CCD solid-state imaging device 10 having the above-mentioned construction is entirely covered with the transparent resin 20 to produce the clear-mold CCD solid-state imaging device 40.

A camera including the clear-mold CCD solid-state imaging device 40 was continuously operated at a temperature in the range of 60° C. to 90° C. and a relative humidity of 30% or lower. In approximately 70 to 100 hours, a black defect was generated in an obtained image. The black defect is a black point or a diversity in brightness generated in an image obtained by a CCD solid-state imaging device.

The black defect is considered to be generated for the following reason.

The transparent resin 20 covering the one-chip CCD solid-state imaging device 10 includes impurity ions such as a fragment of a polymerization initiator. The impurity ions known as moving ions are uniformly distributed in the transparent resin 20. When the transparent resin 20 is heated to a high temperature, the moving ions can easily move in the transparent resin 20. When the clear-mold CCD solid-state imaging device 40 is operated at a high temperature, the moving ions are excited by electric charges generated on a surface of the light receiving section of the one-chip CCD solid-state imaging device 10, thereby gathering to a vicinity of an interface of the transparent resin 20 and the transparent passivation film 17. However, the moving ions, which move slowly in the transparent resin 20, cannot move sufficiently fast in response to a change in the electric charges occurring at the light receiving section. Accordingly, the electric charges of the moving ions undesirably remaining in the vicinity of the interface influence the electric charges generated in the light receiving section. In consequence, the electric charges in the light receiving section are not completely transferred to the CCD 13, or electric charges cannot be generated in accordance with an intensity of incident light. Thus, the black defect is generated.

It was confirmed that the black defect is deleted by stopping the operation of the camera and leaving the clear-mold CCD solid-state imaging device 40 at a temperature in the range of 70° C. to 80° C. Such a phenomenon is considered to occur because the moving ions are dissipated all over the transparent resin 20 from the interface thereof with the transparent passivation film 17.

SUMMARY OF THE INVENTION

A clear-mold solid-state imaging device using a charge coupled device, according to the present invention, in which a solid-state imaging device is molded with a transparent resin includes a surface having a light receiving section; a light shielding film provided over the surface; a transparent passivation film for protecting the light shielding film; and a moving ion blocking layer provided between the transparent passivation film and the transparent resin.

Alternatively, a clear-mold solid-state imaging device using a charge coupled device according to the present invention includes a light receiving section for converting incident light into electric charges; a moving ion blocking layer provided over the light receiving section and formed of a material selected from the group consisting of an acrylic resin, a polystyrene resin, a novolac resin, and a polyimide resin; and a transparent resin provided on the moving ion blocking layer.

Thus, the invention described herein makes possible an advantage of providing a clear-mold solid-state imaging device using a charge coupled device which generates no black defect when being operated at a high temperature for a long period of time.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrating examples with reference to the accompanying drawings.

Figure 1:
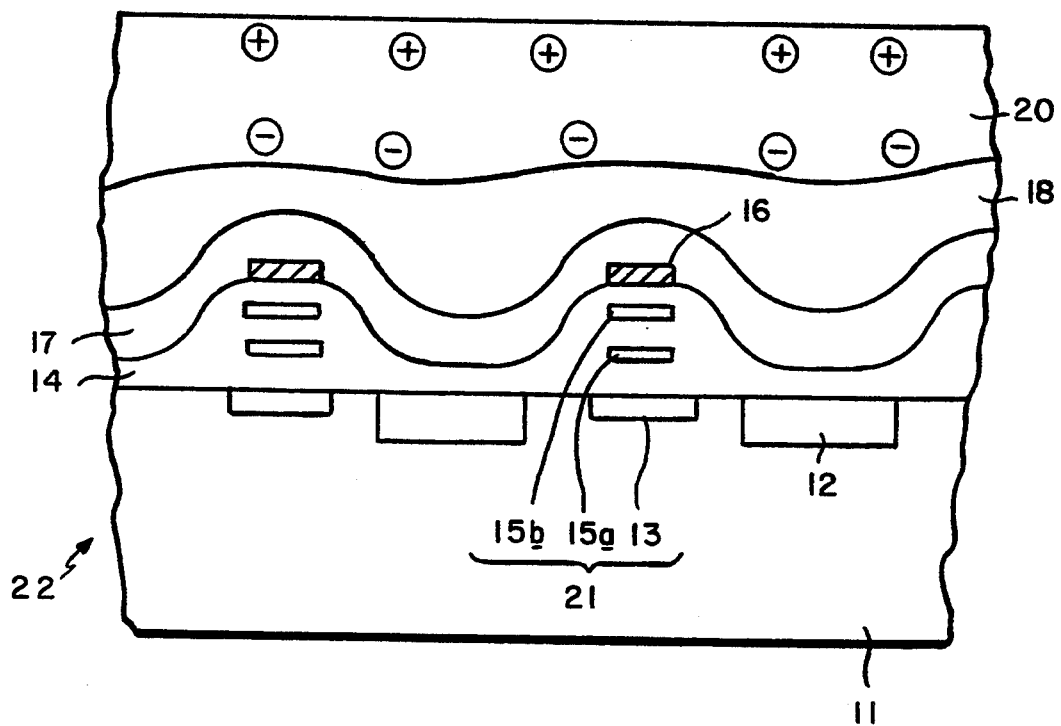
FIG. 1 is a cross sectional view of an essential part of a clear-mold CCD solid-state imaging device according to the present invention.
Figure 2:
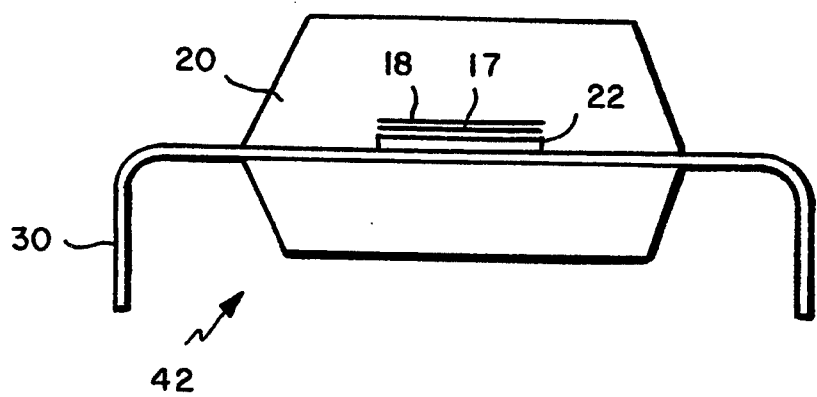
FIG. 2 is a schematic cross sectional view of the clear-mold CCD solid-state imaging device shown in FIG. 1 molded with a transparent resin.
Figure 3:
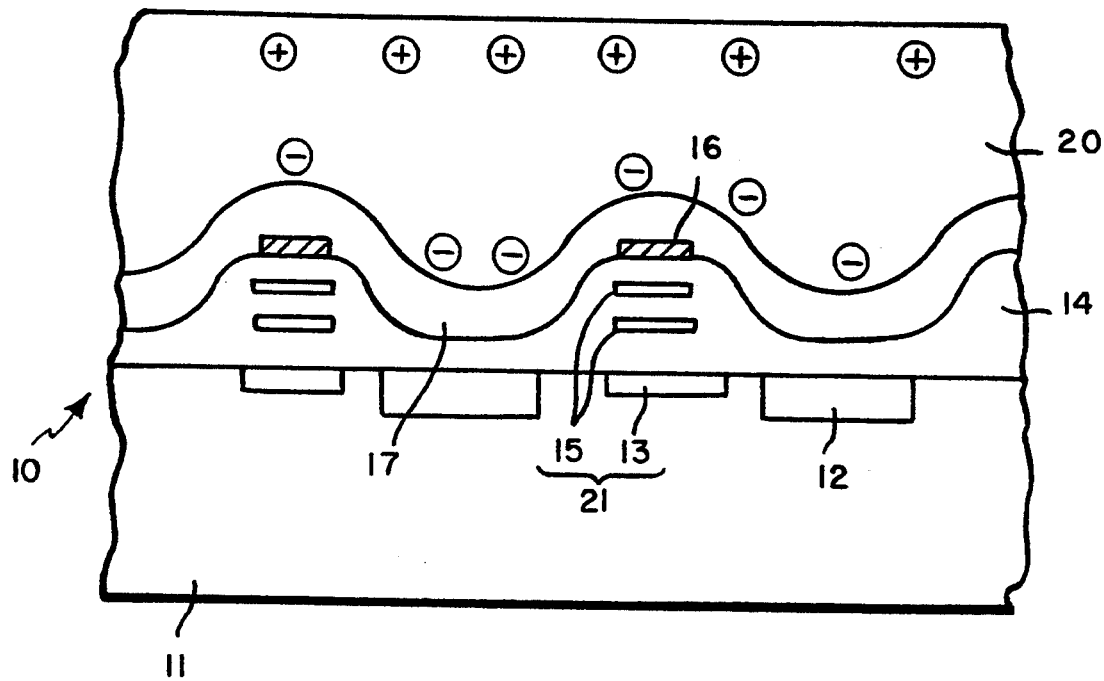
FIG. 3 is a cross sectional view of an essential part of a conventional clear-mold CCD solid-state imaging device.
Figure 4:
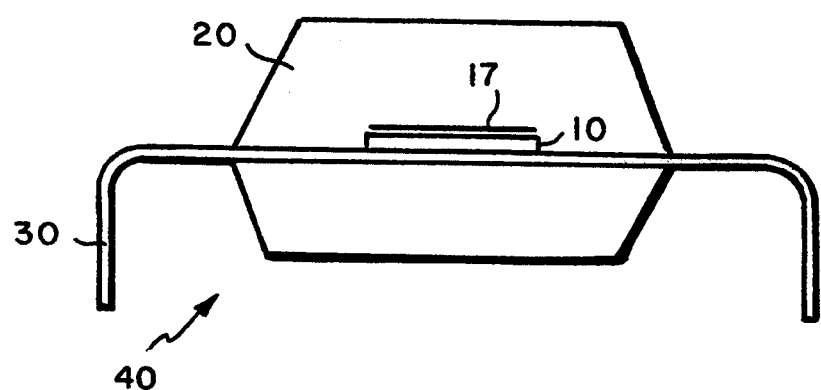
FIG. 4 is a schematic cross sectional view of the conventional clear-mold CCD solid-state imaging device shown in FIG. 3 molded with a transparent resin.

FIG. 2 is a schematic cross sectional view of a clear-mold CCD solid-state imaging device 42 which is molded with a transparent resin 20 according to the present invention. FIG. 1 is a cross sectional view of an essential part of the clear-mold CCD solid-state imaging device 42.

As is shown in FIG. 1, a one-chip CCD solid-state imaging device 22 includes a semiconductor substrate 11, a plurality of photodiodes 12 arranged in a matrix (namely, in a plurality of rows), and CCDs 13 respectively provided adjacent to the rows of the photodiodes 12. The photodiodes 12 each act as a light receiving section for generating electric charges in accordance with an intensity of light incident thereon. A silicon oxide film 14 is provided on the semiconductor substrate 11 so as to cover the photodiodes 12 and the CCDs 13. Two polysilicon electrodes 15a and 15b are provided in a stack above each CCD 13. Each CCD 13 and the two polysilicon electrodes 15a and 15b constitute a transfer section 21 for transferring the electric charges generated by the photodiode 12 to another transfer section (not shown) provided perpendicular to the CCDs 13.

Light shielding films 16 formed of aluminum or the like are provided on areas of a surface of the silicon oxide film 14, the areas being above the polysilicon electrodes 15a and 15b. A transparent passivation film 17 is laminated on the silicon oxide film 14, to protect the light shielding films 16 as well as the lamination beneath the transparent passivation film 17. The one-chip CCD solid-state imaging device 22 further includes a moving ion blocking layer 18 provided on the transparent passivation film 17 and is molded with the transparent resin 20 together with an input/output terminal 30 as is shown in FIG. 2.

Hereinafter, a method for producing the clear-mold CCD solid-state imaging device 42 will be described again with reference to FIGS. 1 and 2.

First, a plurality of photodiodes 12 each acting as a light receiving section and a plurality of CCDs 13 respectively adjacent to the rows of the photodiodes 12 are formed on the semiconductor substrate 11 by use of ion implantation and lithography. Although not shown, another transfer section formed of a CCD is simultaneously formed perpendicular to ends of the CCDs 13 for electric charge transfer.

Then, silicon oxide is deposited on the semiconductor substrate 11 to form the silicon oxide film 14 so as to cover the photodiodes 12 and the CCDs 13. The silicon oxide film 14 is formed in first, second and third layers. After the first layer of silicon oxide is formed, polysilicon is deposited and patterned by use of lithography to form the electrode 15a; and after the second layer of silicon oxide is formed, polysilicon is deposited and patterned again by use of lithography to form the electrode 15b. Then, the third layer of silicon oxide is formed, thereby forming the silicon oxide film 14 including the polysilicon electrodes 15a and 15b therein. Each CCD 13, and the polysilicon electrodes 15a and 15b vertically provided constitute the transfer section 21.

The light shielding films 16 are formed on the areas of the silicon oxide film 14 above the polysilicon electrodes 15a and 15b, preferably of a low resistance metal such as aluminum. The transparent passivation film 17 is formed by depositing silicon oxide or silicon nitride on the silicon oxide film 14 by use of CVD (chemical vapor deposition).

Then, the moving ion blocking layer 18 is formed on the transparent passivation film 17. The moving ion blocking layer 18 is formed of a non-photosensitive or photosensitive resin such as an acrylic resin, a polystyrene resin, a novolac resin, or a polyimide resin. In this example, CMS-Du produced by JAPAN SYNTHETIC RUBBER Co., Ltd. is used as a POLYSTYLENE resin, and FVR-10 produced by FUJI YAKUHIN KOGYO K.K. is used as an acrylic resin.

In the case when a non-photosensitive resin is used, the moving ion blocking layer 18 is formed in the following manner. The transparent passivation film 17 is coated with the resin by use of a spinner. A desired thickness of the resin is obtained by adjusting the viscosity of the resin with solvent addition or by adjusting the spinning speed or the spinning time of the spinner. Then, the obtained substrate is heated at a temperature of 160° C. for 5 minutes on a hot plate to cure the resin. A resist is formed on the resin by use of photolithography. Using the resist as a mask, portions of the resin are etched away by an oxide plasma etching apparatus, to expose electrodes which are to be in contact with the input/output terminal 30. Thus, the moving ion blocking layer 18 is formed.

In the case when a photosensitive resin is used, the moving ion blocking layer 18 is formed in the following manner. The transparent passivation film 17 is coated with the resin by use of a spinner. A desired thickness of the resin is obtained by adjusting the viscosity of the resin with solvent addition or by adjusting the spinning speed or the spinning time of the spinner. Then, the obtained substrate is heated at a temperature of 90° C. for 2 minutes on a hot plate to cure the resin to some extent. Then, the resin is exposed to a light source which emits deep UV (wavelength: 220 nm to 300 nm), g-line (wavelength: 436 nm), or i-line (wavelength: 365 nm) and developed by TMAH (tetramethylammonium hydroxide), thereby removing portions of the resin to expose electrodes which are to be in contact with the input/output terminal 30. Subsequently, the obtained substrate is heated at a temperature of 160° C. for 5 minutes on a hot plate or heated at a temperature of 150° C. for 30 minutes in a clean oven, to cure the resin, thereby obtaining the moving ion blocking layer 18.

The obtained substrate is cleaved into one-chip CCD solid-state imaging devices 22. Then, as is shown in FIG. 2, after electrical connection with the input/output terminal 30, each one-chip CCD solid-state imaging device 22 is molded with the transparent resin 20, thereby producing the clear-mold CCD solid-state imaging device 42.

In order to find a material which excellently performs as the moving ion blocking layer 18, various experiments were conducted. As a result, an acrylic resin and a polystyrene resin were found to be especially preferable among the above-listed resins. These two materials were respectively used for the moving ion blocking layers 18 of the clear-mold CCD imaging devices which are incorporated into cameras, and the cameras were operated at a high temperature for comparison. It was found out that the use of a polystyrene resin for the moving ion blocking layer 18 reliably prevents the generation of a black defect in an image formed by the camera.

It was also confirmed that a sufficient thickness of the moving ion blocking layer 18 formed of a polystyrene resin to reliably prevent the generation of a black defect is 3.0 μm or more. Accordingly, it is preferable to form the moving ion blocking layer 18 of a polystyrene resin in a thickness of 3.0 μm or more.

In the case when an acrylic resin is used for the moving ion blocking layer 18, it was confirmed that a sufficient thickness of the moving ion blocking layer 18 to have some effect of preventing a black defect is 1.5 μm or more. However, when the thickness was 1.5 μm, a pale black point was found.

Ten clear-mold CCD solid-state imaging devices 42 including the moving ion blocking layer 18 formed of a polystyrene resin having a thickness of 3.0 μm and ten conventional clear-mold CCD solid-state imaging devices 40 without a moving ion blocking layer were tested for high-temperature operation. The results obtained after testing the devices 40 and 42 at a temperature of 60° C. and a humidity of 60% to 90% for 72 hours are shown in Table 1. None of the ten clear-mold CCD solid-state imaging devices 42 was defected, while a black defect was generated in all the ten clear-mold CCD solid-state imaging devices 40.

TABLE 1

| | Number tested | Number of defected devices | Defect ratio |
|---|---|---|---|
| With moving ion blocking layer | 10 | 0 | 0% |
| Without moving ion blocking layer | 10 | 10 | 100% |

As has been described so far, a clear-mold CCD solid-state imaging device according to the present invention includes a moving ion blocking layer and a transparent resin which covers the moving ion blocking layer. Accordingly, the movement of the moving ions in the transparent resin is blocked by the moving ion blocking layer. Therefore, it can reliably be prevented that the moving ions approach to the light receiving section and thus generate a black defect. An imaging apparatus including a clear-mold CCD solid-state imaging device according to the present invention has an advantage of significantly improving the reliability thereof.

The one-chip CCD solid-state imaging device 22 is entirely covered with the transparent resin 20 in this example. As long as the light receiving section is covered with a transparent resin, the same effects as in the present example can be achieved even if the device is not entirely covered with the transparent resin. For example, a CCD solid-state imaging device in which only a light receiving section is covered with a transparent resin and the other elements are covered with ceramic, plastics, or the like also prevents the generation of a black defect.

In the case when the light shielding films 16 need not be protected, there is no need for providing the transparent passivation film 17. Still the same effects can be achieved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A clear-mold solid-state imaging device including a charge coupled device, said imaging device comprising:
   a surface having a light receiving section;
   a light shielding film provided over the surface;
   a transparent passivation film for protecting the light shielding film;
   a transparent resin entirely covering the surface, the transparent resin including moving ions; and
   a moving ion blocking layer provided between the transparent passivation film and the transparent resin, for blocking movement of the moving ions.

2. A clear-mold solid-state imaging device using a charge coupled device according to claim 1, wherein the moving ion blocking layer is formed of a material selected from the group consisting of an acrylic resin, a polystyrene resin, a novolac resin, and a polyimide resin.

3. A clear-mold solid-state imaging device using a charge coupled device according to claim 1, wherein the moving ion blocking layer is formed of an acrylic resin having a thickness of at least 1.5 μm.

4. A clear-mold solid-state imaging device using a charge coupled device according to claim 1, wherein the moving ion blocking layer is formed of a polystyrene resin having a thickness of at least 3.0 μm.

5. A clear-mold solid-state imaging device including a charge coupled device, the clear-mold solid-state imaging device comprising:
   a light receiving section for converting incident light into electric charges;
   a transparent resin covering at least the light receiving section, the transparent resin including moving ions; and
   a moving ion blocking layer provided between the light receiving section and the transparent resin, for blocking movement of the moving ions;
   wherein the moving ion blocking layer is formed of an acrylic resin having a thickness of at least 1.5 μm.

6. A clear-mold solid-state imaging device including a charge coupled device, the clear-mold solid-state imaging device comprising:
   a light receiving section for converting incident light into electric charges;
   a transparent resin covering at least the light receiving section, the transparent resin including moving ions; and
   a moving ion blocking layer provided between the light receiving section and the transparent resin, for blocking movement of the moving ions;
   wherein the moving ion blocking layer is formed of a polystyrene resin having a thickness of at least 3.0 μm.

* * * * *